United States Patent
Furukawa et al.

(10) Patent No.: US 6,998,332 B2
(45) Date of Patent: Feb. 14, 2006

(54) METHOD OF INDEPENDENT P AND N GATE LENGTH CONTROL OF FET DEVICE MADE BY SIDEWALL IMAGE TRANSFER TECHNIQUE

(75) Inventors: Toshiharu Furukawa, Essex Junction, VT (US); Steven J. Holmes, Guilderland, NY (US); William H-L Ma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 240 days.

(21) Appl. No.: 10/754,073

(22) Filed: Jan. 8, 2004

(65) Prior Publication Data

US 2005/0153562 A1 Jul. 14, 2005

(51) Int. Cl.
*H01L 21/3205* (2006.01)
*H01L 21/4763* (2006.01)

(52) U.S. Cl. ............... 438/585; 438/586; 438/587; 438/588

(58) Field of Classification Search ......... 438/585–588
See application file for complete search history.

(56) References Cited

U.S. PATENT DOCUMENTS

| 5,759,638 | A | | 6/1998 | Imai et al. |
| 6,013,570 | A | * | 1/2000 | Yu et al. ............ 438/595 |
| 6,100,172 | A | | 8/2000 | Furukawa et al. |
| 6,194,268 | B1 | | 2/2001 | Furukawa et al. |
| 6,207,490 | B1 | * | 3/2001 | Lee ............ 438/241 |
| 6,350,390 | B1 | * | 2/2002 | Liu et al. ............ 216/59 |
| 6,475,891 | B2 | * | 11/2002 | Moon ............ 438/584 |
| 6,924,191 | B2 | * | 8/2005 | Liu et al. ............ 438/241 |
| 2001/0053570 | A1 | | 12/2001 | Kido |

* cited by examiner

*Primary Examiner*—Duy-Vu N. Deo
(74) *Attorney, Agent, or Firm*—Gibb I.P. Law Firm, LLC; Ira D. Blecker, Esq.

(57) ABSTRACT

Disclosed is a method that forms a conductive layer on a substrate and patterns sacrificial structures above the conductive layer. Next, the invention forms sidewall spacers adjacent the sacrificial structures using a spacer material capable of undergoing dimensional change, after which the invention removes the sacrificial structures in processing that leaves the sidewall spacers in place. The invention then protects selected ones of the sidewall spacers using a sacrificial mask and leaves the other ones of the sidewall spacers unprotected. This allows the invention to selectively expose the unprotected sidewall spacers to processing that changes the size of the unprotected sidewall spacers. This causes the unprotected sidewall spacers have a different size than protected sidewall spacers. Then, the invention removes the sacrificial mask and patterns the conductive layer using the sidewall spacers as a gate conductor mask to create differently sized gate conductors on the substrate. Following this, the invention removes the sidewall spacers and forms the source, drain, and channel regions adjacent the gate conductors.

20 Claims, 3 Drawing Sheets

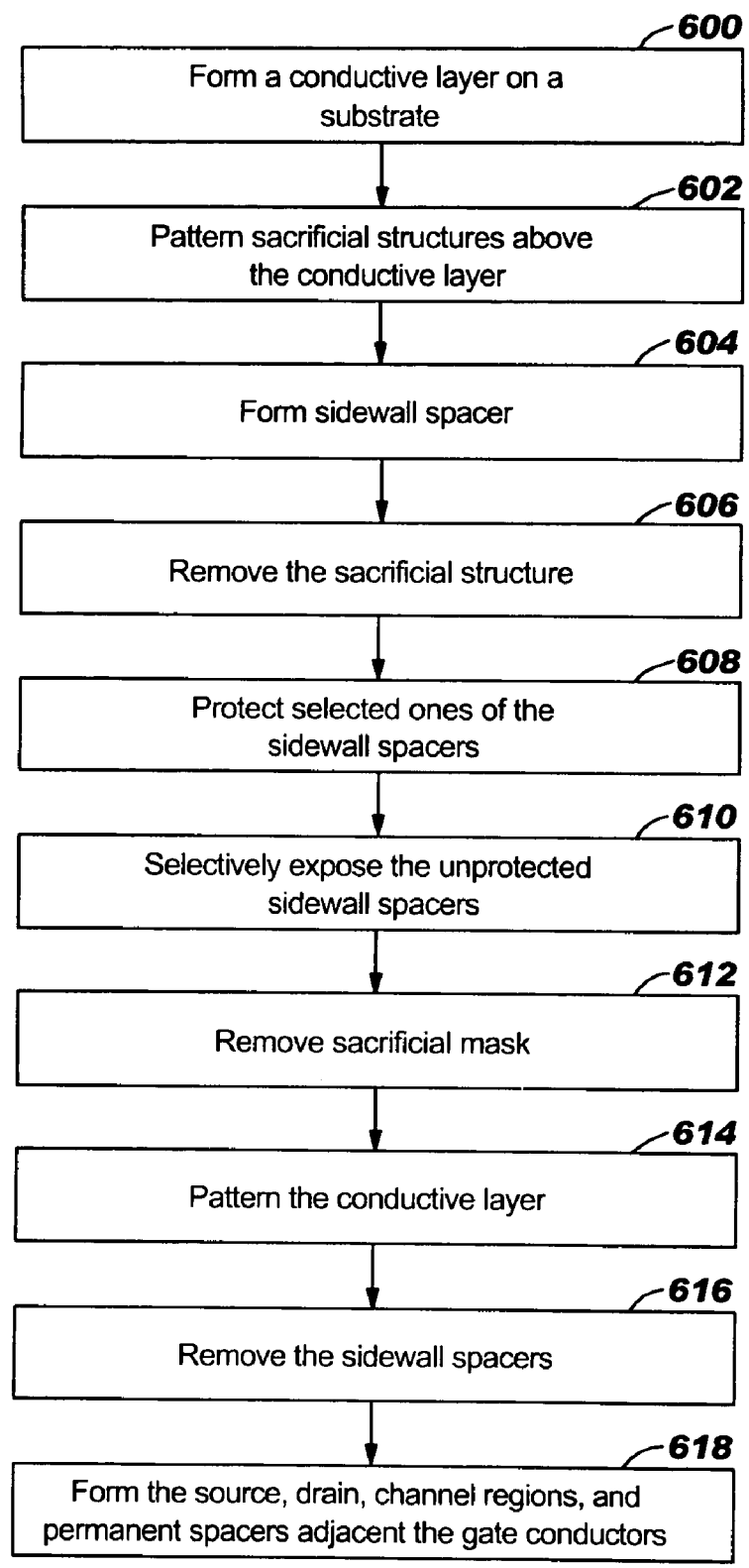

METHOD OF INDEPENDENT P AND N GATE LENGTH CONTROL OF FET DEVICE MADE BY SIDEWALL IMAGE TRANSFER TECHNIQUE

BACKGROUND OF THE INVENTION

1. Field of the Invention

The present invention generally relates to a method of making independently optimized P and NFET devices with different gate lengths by SIT technique. The invention directly modifies the spacer width without the need for added resist etch processes.

2. Description of the Related Art

As the industry pushes integrated circuit chip performance, the device gate length is being reduced to about half of the minimum lithographic dimension, and is still shrinking. Such sublithographic gate dimensions are achieved by trimming the etching mask (either hard mask or photoresist) of the gate material before the gate material etch. However, the tolerance of this method is inherently unstable because of the difficulty in controlling the photolithography and etch dimensions, as well as the trim dimension.

Sidewall image transfer (SIT) has been known to produce FET devices of sublithographic dimensions with superior gate length control. However, each SIT process only produces one sublithographic gate length, which is a serious shortcoming of this technique since PFET and NFET device require different gate widths to optimize both PFET and NFET device performance. In order to independently adjust the width of these features with SIT, an additional resist apply, expose, and etch process is needed to trim the spacers to a smaller width where desired, or to form an additional spacer where desired in order to widen some patterns. The invention described below addresses these needs.

SUMMARY OF THE INVENTION

The invention provides a method of simultaneously forming different types of field effect transistors (e.g., N-type and P-type) on the same substrate. This method forms a conductive layer on a substrate and patterns sacrificial structures above the conductive layer. Next, the invention forms sidewall spacers adjacent the sacrificial structures using a spacer material capable of undergoing dimensional change, after which the invention removes the sacrificial structures in processing that leaves the sidewall spacers in place. The invention then protects selected ones of the sidewall spacers using a sacrificial mask and leaves the other ones of the sidewall spacers unprotected. This allows the invention to selectively expose the unprotected sidewall spacers to processing that changes the size of the unprotected sidewall spacers. This causes the unprotected sidewall spacers have a different size than the protected sidewall spacers. Then, the invention removes the sacrificial mask and patterns the conductive layer using the sidewall spacers as a gate conductor mask to create differently sized gate conductors on the substrate. Following this, the invention removes the sidewall spacers and forms the source, drain, and channel regions adjacent the gate conductors.

The spacer material can comprises a photosensitive material or a radiation sensitive material such as a polysilane material or an organic polymer. This processing that changes the size of the unprotected sidewall spacers comprises exposure to light or electron beams, etching, or chemical processing. This processing can increase or decrease the size of the unprotected sidewall spacers. The size of the gate conductors is controlled by the size of the sidewall spacers, such that gate conductors below the unprotected sidewall spacers will have a different size than gate conductors below the protected sidewall spacers after the process of patterning the conductive layer. The process of forming the sidewall spacers first deposits the same spacer material over all the sacrificial structures simultaneously and then directionally etches the spacer material (in a process that removes material from horizontal surfaces faster than from vertical surfaces) until the spacer material remains only on the sidewalls of the sacrificial structures.

The invention utilizes a single sidewall image transfer pattern and single etching process to simultaneously create different sized gate conductors that are highly useful with different types of transistors formed simultaneously on a single substrate. The invention eliminates the need to create multiple sidewall image transfer patterns and instead processes a single sidewall image transfer pattern to selectively change the size of selected sidewalls. This processing dramatically simplifies and reduces the number of manufacturing steps required, and thereby increases the manufacturing yield because each additional processing step adds the potential for manufacturing error. In addition, the invention provides precise control over the size difference between the different types of gates patterned with the invention because the selective enlargement or reduction processing is easily controlled. Therefore, the invention provides a number of benefits when compared to conventional processes involved with the simultaneous formation of different types of transistors on a single substrate.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIG. 6 is a flow diagram illustrating a preferred method of the invention.

DETAILED DESCRIPTION OF PREFERRED EMBODIMENTS OF THE INVENTION

Figure 1:
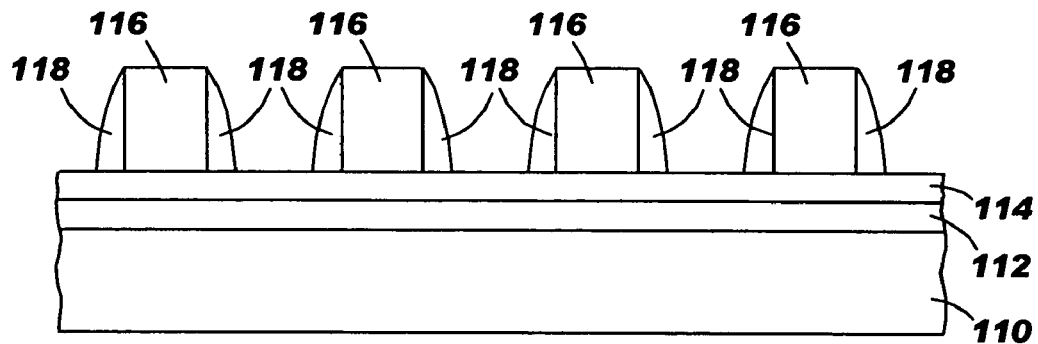
FIG. 1 is a schematic diagram of a partially completed structure according to the invention.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As shown in FIGS. 1–5, the invention provides a method of simultaneously forming different types of field effect transistors (e.g., N-type and P-type) on the same substrate. More specifically, as shown in FIG. 1, a conductive layer 112 is formed on a substrate 110. If desired, the conductive layer can be protected during subsequent etching processes using a hard mask 114 such as a silicon nitride hard mask. The substrate 110 can be any useful material, such as single crystal silicon 110 or any other type of substrate depending upon the specific design requirements. The invention patterns sacrificial structures 116 above the conductive layer 112 or optional hard mask 114.

Next, the invention forms sidewall spacers 118 adjacent the sacrificial structures 116 using a spacer material 118 capable of undergoing dimensional change. The process of forming the sidewall spacers 118 first deposits the same spacer material 118 over all the sacrificial structures 116 simultaneously in, for example, a chemical vapor deposition (CVD) process (although any conventional material forming process can be used depending upon the nature of the spacer material 118). Next, the invention directionally (anisotropically) etches the spacer material 118 (in processing that removes material from horizontal surfaces faster than from vertical surfaces) until the spacer material 118 remains only on the sidewalls of the sacrificial structures 116. The spacer material 118 can comprises any material that can be selectively expanded or contracted. For example, the spacer material 118 can comprise a photosensitive material (such as a polysilane material), a radiation sensitive material (such as an organic polymer), a chemically sensitive material (for example any material that can be oxidized or etched), or any other material that can be dimensionally changed through mask-type processing.

Figure 2:
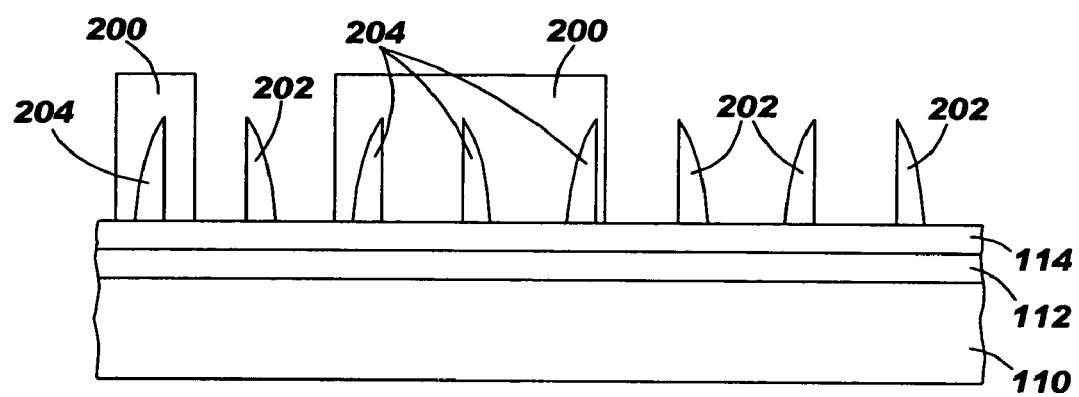
FIG. 2 is a schematic diagram of a partially completed structure according to the invention.

As shown in FIG. 2, the invention removes the sacrificial structures 116 in processing that leaves the sidewall spacers in place using, for example, a selective etching process or any other well-known selective removal processing. This leaves a sidewall image transfer (SIT) pattern over the conductive layer 112. The invention then protects selected ones (204) of the sidewall spacers using a patterned sacrificial mask 200 and leaves the other ones (202) of the sidewall spacers unprotected. This allows the invention to selectively expose the unprotected sidewall spacers 202 to processing that changes the size of the unprotected sidewall spacers 202. As mentioned above, the processing that changes the size of the unprotected sidewall spacers 202 can comprise, for example, exposure to light or electron beams, etching, or chemical processing. The actual processing that is used to enlarge the size of the unprotected sidewall spacers 202 depends upon the material makeup of the sidewall spacers themselves. Therefore, as mentioned above, the invention can use a certain wavelength of light, an electron beam radiation, oxidizing processes, etching processes, etc. to change the size of the unprotected sidewall spacers 202, because the invention uses a photosensitive, radiation sensitive, chemically sensitive, etc. material to form all the sidewall spacers 118.

For example, AMAT (located in, Sunnyvale, Calif., U.S.A.) offers a methylsilane CVD resist, which involves a plasma deposition from methylsilane gas to form a polysilane material on the wafer substrate 110. This polysilane film is sensitive to UV light. When the polysilane is exposed, it reacts with oxygen from the air to form a silicon oxide material. As this sidewall spacer material absorbs oxygen from the air, the sidewall spacers become thicker, and thereby provides a means of varying the width of the spacers in the SIT process. It is possible to vary the width growth of the spacer by varying the exposure dose and the exposure time to oxygen environment.

As another example, the invention can use organic polymers for the sidewall spacer material 118. In this process, a plasma CVD deposition of the organic material would be made over the SIT mandrels 116. An example would be plasma polymerization of maleic anhydride, as described in 'Controlled Attachment of PAMAM Dendrimers to Solid Surfaces, J. P. S. Badyal et al., Langmuir, volume 18, 2002, pp. 264–268, which is incorporated herein by reference. The maleic anhydride film can be reduced in thickness by exposure to Ebeam. The organic polymer materials can be selectively exposed with projection Ebeam lithography tools to cause slimming of the spacer width where they are exposed. The Ebeam irradiation causes breakdown of the polymer to volatile products, which reduces the image width. The amount of image width reduction can be modulated with the control of exposure time.

One ordinarily skilled in the art would understand that the invention is not limited to the materials or processing mentioned herein. To the contrary, any suitable material and associated process that causes the sidewall spacer material to be enlarged or reduced in size can be used with the invention, and the invention is not limited to the specific sidewall spacer materials or enlargement/reduction processes mentioned herein.

Figure 3:
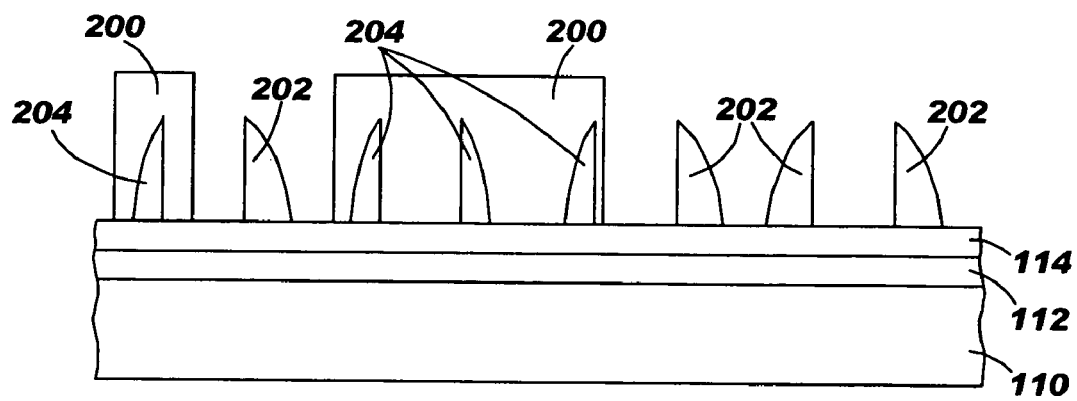
FIG. 3 is a schematic diagram of a partially completed structure according to the invention.
Figure 4:
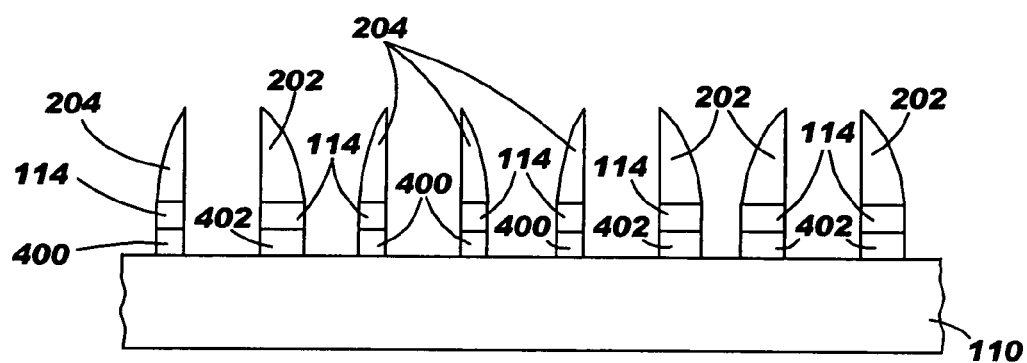
FIG. 4 is a schematic diagram of a partially completed structure according to the invention.
Figure 5:
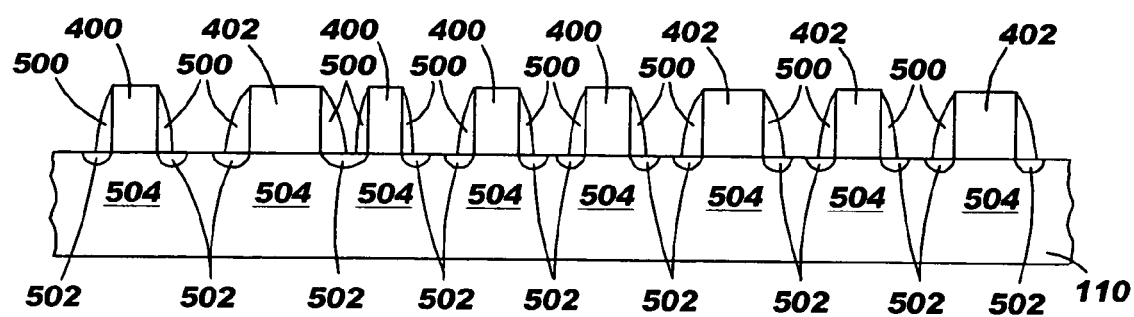
FIG. 5 is a schematic diagram of a partially completed structure according to the invention.

Therefore, the inventive processing can increase or decrease the size of the unprotected sidewall spacers 202. As shown in FIG. 3, this processing causes the protected sidewall spacers 204 have a different size than the unprotected sidewall spacers 204. Then, as shown in FIG. 4, the invention removes the sacrificial mask 200 and patterns the conductive layer 112 into individual gate conductors 400, 402 using the sidewall spacers 202, 204 (and optional hard mask 114) as a gate conductor mask to simultaneously create differently sized gate conductors on the substrate. As shown in FIG. 4, the size of the gate conductors 400, 402 is controlled by the size of the sidewall spacers 202, 204 above the gate conductors 400, 402. Therefore, the gate conductors 402 below the unprotected sidewall spacers 202 will have a different size than gate conductors 400 below the protected sidewall spacers 204 after the process of patterning the conductive layer. Following this, the invention removes the sidewall spacers and forms the source/drain 502, channel regions 504, and permanent spacers 500 adjacent the gate conductors 400, 402 using well-known processes, as shown in FIG. 5.

FIG. 6 shows the invention in flowchart form. More specifically, the invention forms a conductive layer on a substrate 600 and patterns sacrificial structures above the conductive layer 602. Next, the invention forms sidewall spacers 604 adjacent the sacrificial structures using a spacer material capable of undergoing dimensional change, after which the invention removes the sacrificial structures 606 in processing that leaves the sidewall spacers in place. The invention then protects selected ones of the sidewall spacers 608 using a sacrificial mask and leaves the other ones of the sidewall spacers unprotected. This allows the invention to selectively expose the unprotected sidewall spacers to processing that changes the size of the unprotected sidewall spacers 610. This causes the protected sidewall spacers to have a different size than unprotected sidewall spacers. Then, the invention removes the sacrificial mask 612 and patterns the conductive layer 614 using the sidewall spacers as a gate conductor mask to create differently sized gate conductors on the substrate. Following this, the invention removes the sidewall spacers 616 and forms the source, drain, channel regions, and permanent spacers adjacent the gate conductors 618.

Thus, as shown above, the invention utilizes a single sidewall image transfer pattern and single etching process to simultaneously create different sized gate conductors that are highly useful with different types of transistors formed simultaneously on a single substrate. The invention eliminates the need to create multiple sidewall image transfer patterns and instead processes a single sidewall image transfer pattern to selectively change the size of selected sidewalls. This processing dramatically simplifies and reduces the number of manufacturing steps required, and thereby increases the manufacturing yield because each additional processing step adds the potential for manufacturing error. In addition, the invention provides precise control over the size difference between the different types of gates patterned with the invention because the selective enlargement or reduction processing is easily controlled. Therefore, the invention provides a number of benefits when compared to conventional processes involved with the simultaneous formation of different types of transistors on a single substrate.

While the invention has been described in terms of preferred embodiments, those skilled in the art will recognize that the invention can be practiced with modification within the spirit and scope of the appended claims.

What is claimed is:

1. A method of simultaneously forming different sized gate conductors on the same substrate, said method comprising:

forming a conductive layer on a substrate;

patterning sacrificial structures above said conductive layer;

forming sidewall spacers adjacent said sacrificial structures using a spacer material capable of undergoing dimensional change;

removing said sacrificial structures in processing that leaves said sidewall spacers in place;

protecting selected ones of said sidewall spacers using a sacrificial mask and leaving others of said sidewall spacers unprotected;

exposing unprotected sidewall spacers to processing that changes the size of said unprotected sidewall spacers, after which said unprotected sidewall spacers have a different size than protected sidewall spacers;

removing said sacrificial mask; and patterning said conductive layer using said sidewall spacers as a gate conductor mask to simultaneously create differently sized gate conductors on said substrate.

2. The method in claim 1, wherein said process of exposing said sidewall spacers to said processing that changes said size of said unprotected sidewall spacers comprises exposure to light or electron beams, etching, or chemical processing.

3. The method in claim 1, wherein said process of exposing said sidewall spacers to said processing that changes said size of said unprotected sidewall spacers can increase or decrease said size of said unprotected sidewall spacers.

4. The method in claim 1, wherein the size of said gate conductors is controlled by the size of said sidewall spacers, such that gate conductors below said unprotected sidewall spacers will have a different size than gate conductors below said protected sidewall spacers after said process of patterning said conductive layer.

5. The method in claim 1, wherein said process of forming said sidewall spacers comprises:

depositing said spacer material over said sacrificial structures; and directionally etching said spacer material in processing that removes material from horizontal surfaces faster than from vertical surfaces until said spacer material remains only on the sidewalls of said sacrificial structures.

6. The method in claim 1, wherein said spacer material comprises one of a photosensitive material and a radiation sensitive material.

7. The method in claim 1, wherein said spacer material comprises one of a polysilane material and an organic polymer.

8. A method of simultaneously forming different types of field effect transistors on the same substrate, said method comprising:

forming a conductive layer on a substrate;

patterning sacrificial structures above said conductive layer;

forming sidewall spacers adjacent said sacrificial structures using a spacer material capable of undergoing dimensional change;

removing said sacrificial structures in processing that leaves said sidewall spacers in place;

protecting selected ones of said sidewall spacers using a sacrificial mask and leaving others of said sidewall spacers unprotected;

exposing unprotected sidewall spacers to processing that changes the size of said unprotected sidewall spacers, after which said unprotected sidewall spacers have a different size than protected sidewall spacers;

removing said sacrificial mask;

patterning said conductive layer using said sidewall spacers as a gate conductor mask to simultaneously create differently sized gate conductors on said substrate;

removing said sidewall spacers; and forming source, drain, and channel regions adjacent said gate conductors.

9. The method in claim 8, wherein said process of exposing said sidewall spacers to said processing that changes said size of said unprotected sidewall spacers comprises exposure to light or electron beams, etching, or chemical processing.

10. The method in claim 8, wherein said process of exposing said sidewall spacers to said processing that changes said size of said unprotected sidewall spacers can increase or decrease said size of said unprotected sidewall spacers.

11. The method in claim 8, wherein the size of said gate conductors is controlled by the size of said sidewall spacers, such that gate conductors below said unprotected sidewall spacers will have a different size than gate conductors below said protected sidewall spacers after said process of patterning said conductive layer.

12. The method in claim 8, wherein said processing of forming said sidewall spacers comprises:

depositing said spacer material over said sacrificial structures; and directionally etching said spacer material in process that removes material from horizontal surfaces faster than from vertical surfaces until said spacer material remains only on the sidewalls of said sacrificial structures.

13. The method in claim 8, wherein said spacer material comprises one of a photosensitive material and a radiation sensitive material.

14. The method in claim 8, wherein said spacer material comprises one of a polysilane material and an organic polymer.

15. A method of simultaneously forming N-type and P-type field effect transistors (FETs) on the same substrate, said method comprising:

forming a conductive layer on a substrate;

patterning sacrificial structures above said conductive layer;

forming sidewall spacers adjacent said sacrificial structures using a spacer material capable of undergoing dimensional change;

removing said sacrificial structures in processing that leaves said sidewall spacers in place;

protecting selected ones of said sidewall spacers using a sacrificial mask and leaving others of said sidewall spacers unprotected;

exposing unprotected sidewall spacers to processing that changes the size of said unprotected sidewall spacers, after which said unprotected sidewall spacers have a different size than protected sidewall spacers;

removing said sacrificial mask;

patterning said conductive layer using said sidewall spacers as a gate conductor mask to simultaneously create differently sized gate conductors for said N-type FETs when compared to said P-type FETs on said substrate;

removing said sidewall spacers; and forming source, drain, and channel regions adjacent said gate conductors.

16. The method in claim 15, wherein said process of exposing said sidewall spacers to said processing that changes said size of said unprotected sidewall spacers comprises exposure to light or electron beams, etching, or chemical processing.

17. The method in claim 15, wherein said process of exposing said sidewall spacers to said processing that changes said size of said unprotected sidewall spacers can increase or decrease said size of said unprotected sidewall spacers.

18. The method in claim 15, wherein the size of said gate conductors is controlled by the size of said sidewall spacers, such that gate conductors below said unprotected sidewall spacers will have a different size than gate conductors below said protected sidewall spacers after said process of patterning said conductive layer.

19. The method in claim 15, wherein said spacer material comprises one of a photosensitive material and a radiation sensitive material.

20. The method in claim 15, wherein said spacer material comprises one of a polysilane material and an organic polymer.

* * * * *